(12) United States Patent
Roes (10) Patent No.: US 6,836,315 B2
(45) Date of Patent: Dec. 28, 2004

(54) LITHOGRAPHIC APPARATUS AND DEVICE MANUFACTURING METHOD

(75) Inventor: Fransiscus Martines Roes, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/419,983

(22) Filed: Apr. 22, 2003

(65) Prior Publication Data

US 2004/0016891 A1 Jan. 29, 2004

(30) Foreign Application Priority Data

Apr. 23, 2002 (EP) ............................................ 02252853

(51) Int. Cl.⁷ .............................................. G03B 27/42
(52) U.S. Cl. ............................ 355/53; 396/72; 396/75; 310/10; 310/12; 318/563; 318/574; 318/625; 318/568.17
(58) Field of Search .............................. 355/53, 72–77; 310/10, 12; 318/568.17, 649, 687, 563; 414/935

(56) References Cited

U.S. PATENT DOCUMENTS

| 5,196,745 | A | 3/1993 | Trumper |
| 6,028,376 | A | 2/2000 | Osanai et al. |
| 6,144,118 | A | 11/2000 | Cahill et al. |
| 6,147,421 | A | 11/2000 | Takita et al. |
| 6,208,045 | B1 | 3/2001 | Hazelton et al. |
| 2002/0000904 | A1 | 1/2002 | Compter et al. |

FOREIGN PATENT DOCUMENTS

| DE | 31 23 759 A1 | 7/1982 |
| EP | 0 502 578 A1 | 9/1992 |
| EP | 1 001 512 A2 | 5/2000 |

*Primary Examiner*—D. Rutledge
(74) *Attorney, Agent, or Firm*—Pillsbury Winthrop LLP (57) ABSTRACT

A method of providing pitch torque compensation for planar motors in which pitch torque is not inherently provided includes calculating and summing a given set of forces ideally required to be applied by each forcer in the planar motor. Correction forces for each forcer are determined such that the net effect of the corrections is equal and opposite to the pitch torques previously determined.

21 Claims, 7 Drawing Sheets

$$\begin{bmatrix} Fx_{y1} \\ Fy_{y1} \\ Fx_{y2} \\ Fy_{y2} \\ Fz_{x1} \\ Fz_{y1} \\ Fz_{x2} \\ Fz_{y2} \end{bmatrix}_{Real} = \frac{1}{2} \begin{bmatrix} 2 & 0 & 0 & 0 & 0 & 0 & 0 & 0 \\ 0 & 2 & 0 & 0 & 0 & 0 & 0 & 0 \\ 0 & 0 & 2 & 0 & 0 & 0 & 0 & 0 \\ 0 & 0 & 0 & 2 & 0 & 0 & 0 & 0 \\ \alpha \cdot \frac{(y_{y1}+\theta)}{D} & -\alpha \cdot \frac{(y_{y1}-\theta)}{D} & -\frac{\phi}{D} \cdot x_{y1} & \frac{\phi}{D} \cdot x_{y1} & \frac{E}{D} & 0 & 0 & 0 \\ -\frac{y_{x1}}{D} \alpha & \frac{y_{x1}}{D} \alpha & \frac{\phi}{D}(x_{x1}-\beta) & \frac{\phi}{D}(x_{x1}-\beta) & -\beta \cdot \frac{(y_{y1}+\theta)}{D} & -\beta \cdot \frac{(y_{y1}-\theta)}{D} & \theta \cdot \frac{(x_{x1}-\beta)}{D} & \theta \cdot \frac{(x_{x1}-\beta)}{D} \\ \frac{y_{x1}}{D} \alpha & \frac{y_{x1}}{D} \alpha & \frac{\phi}{D}(x_{x1}-\beta) & -\phi \cdot \beta & \frac{y_{x1}}{D} \frac{\beta}{D} & \frac{y_{x1}}{D} \frac{\beta}{D} & \frac{x_{y1}}{D} & \frac{x_{y1}}{D} \\ -\frac{y_{x1}}{D} \alpha & \frac{y_{x1}}{D} \alpha & \frac{\phi}{D}(x_{x1}-\beta) & \frac{\phi}{D}(x_{x1}-\beta) \cdot \beta & \frac{y_{x1}}{D} \frac{\beta}{D} & \frac{\beta}{D} & \frac{\theta}{D} & \frac{F}{D} \end{bmatrix} \begin{bmatrix} Fx_{y1} \\ Fy_{y1} \\ Fx_{y2} \\ Fy_{y2} \\ Fz_{x1} \\ Fz_{y1} \\ Fz_{x2} \\ Fz_{y2} \end{bmatrix}_{Ideal}$$

Where:

$D = (y_{x1} \cdot x_{y1} - \beta \cdot \theta + x_{x1} \cdot y_{y1} + x_{x1} \cdot \theta - \beta \cdot y_{y1})$ $E = (2 \cdot y_{x1} \cdot x_{y1} + 2 \cdot x_{x1} \cdot y_{y1} + 2 \cdot x_{x1} \cdot \theta - \beta \cdot \theta - \beta \cdot y_{y1})$ $F = (2 \cdot y_{x1} \cdot x_{y1} - \beta \cdot \theta + 2 \cdot x_{x1} \cdot y_{y1} + x_{x1} \cdot \theta - 2 \cdot \beta \cdot y_{y1})$

LITHOGRAPHIC APPARATUS AND DEVICE MANUFACTURING METHOD

RELATE APPLICATION

This application claims the benefit of priority to European Patent Application No. 02252853.3, filed Apr. 23, 2002, the contents of which are herein incorporated by reference.

BACKGROUND OF THE INVENTION

1. Field of the Invention

The present invention relates to a lithographic apparatus and device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described above, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as set forth above.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

Figure 2:
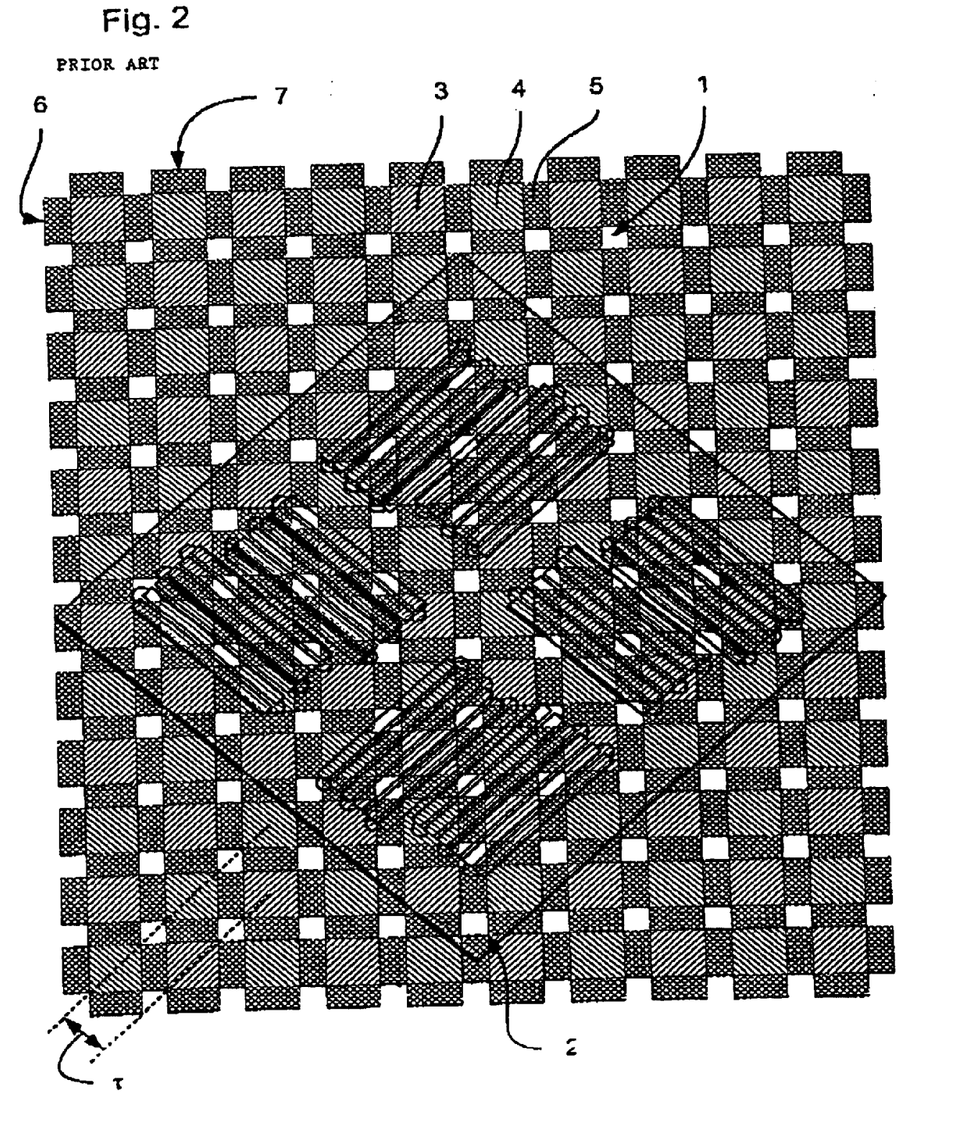
FIG. 2 depicts a planar motor of a known design.

Referring to FIG. 2, a planar motor of a previously known design for positioning the patterning device and/or the substrate table is shown. Further information on such planar motors may be found in U.S. Pat. No. 6,531,793. The planar motor includes a stationary part 1 and a movable part 2. The stationary part 1 includes a plurality of permanent magnets 3, 4, 5, secured on a carrier. These magnets are arranged in rows 6 and columns 7.

Figure 3:
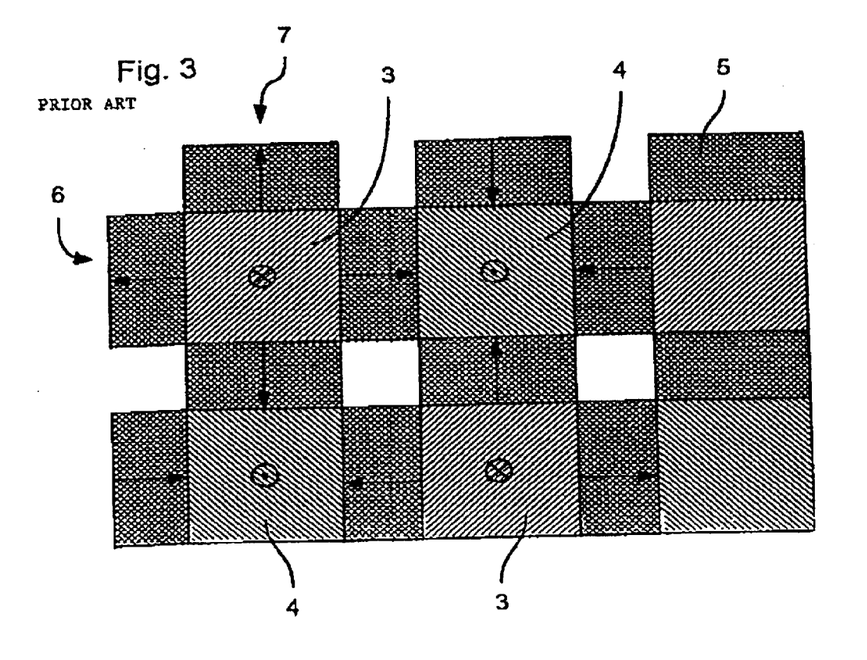
FIG. 3 depicts a detail of the stationary part of the planar motor of FIG. 2.

FIG. 3 shows details of the stationary part 1 of the planar motor, including the orientation of the magnets. The arrows indicate the direction of the magnetic polarization of the magnets. In each of the rows 6 and columns 7, adjacent primary magnets 3, 4 are orientated such that their magnetic polarization are anti-parallel to each other and perpendicular to the plane of the stationary part 1 of the planar motor. Between each of the primary magnets 3, 4 additional magnets 5 are arranged in a so-called Halbach configuration, such that their magnetic polarization is perpendicular to that of the primary magnets 3, 4.

Figure 4:
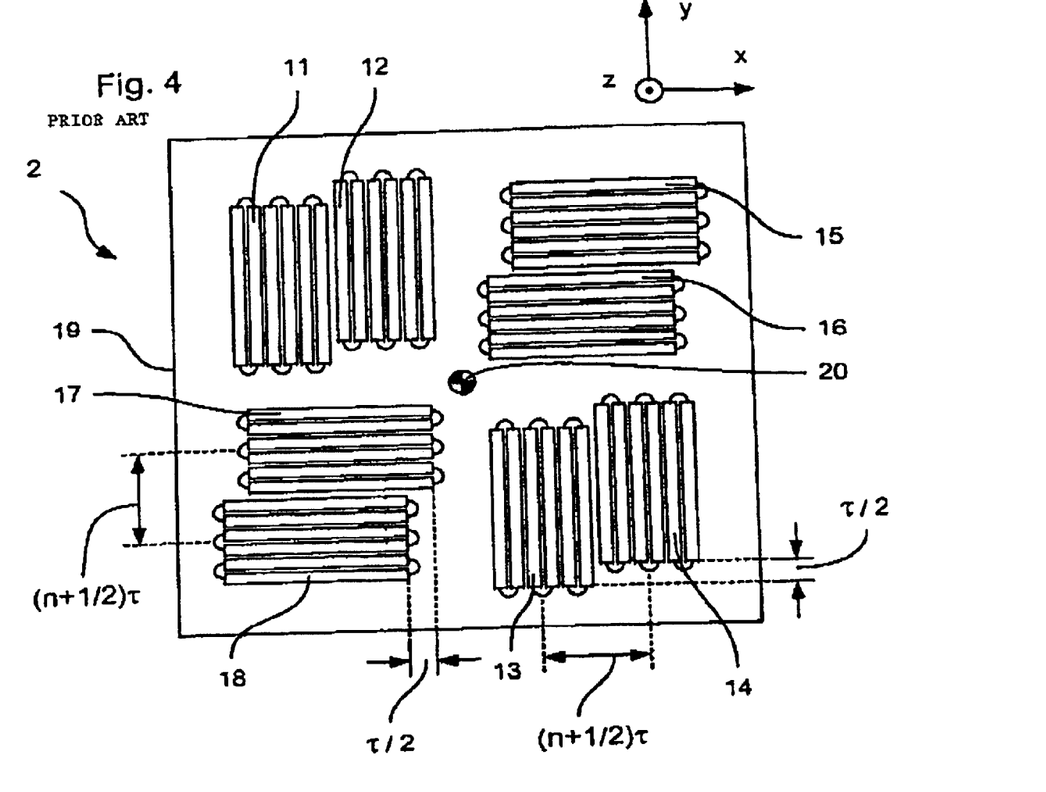
FIG. 4 depicts the moving part of a planar motor of the planar motor of FIG. 2.

FIG. 4 shows details of the moving part 2. For convenience, a set of orthogonal axis X, Y and Z are defined, as shown, such that the X and Y axis are in the plane of the planar motor and the Z axis is perpendicular to the plane of the planar motor. The center of mass 20 of the moving part 2 of the planar motor may be used as the origin. The moving part 2 of the planar motor consists of 8 coil sets 11–18 mounted on a base 19. Each of the coil sets 11–18 are provided with three phase currents which enable the coil sets 11–18, referred to as "forcers," to provide a force in the X or Y direction, depending on their orientation, and a force in the Z direction. The forcers 11–18 are arranged in pairs. As shown in FIG. 4, forcer pairs 11, 12 and 13, 14 are orientated such that their primary axis is in the Y direction. These forcer pairs are therefore able to produce force in the X direction as well as the Z direction. The remaining forcer pairs 15, 16 and 17, 18 are orientated such that their primary axis is in the X direction. These forcer pairs provide forces in the Y direction as well as the Z direction. To produce a force on the moving part 2 in the X direction, the first pair of X-forcers 11, 12 and the second pair of X-forcers 13, 14 operate in unison. When the first pair of X-forcers 11, 12 and the second pair of X-forcers 13, 14 operate in opposite directions a torque about the Z axis is produced on the moving part 2 of the planar motor. Similarly, to produce a force on the moving part 2 of the planar motor in the Y direction, the first pair of Y-forcers 15, 16 and the second pair of Y-forcers 17, 18 operate in unison. When the first pair of Y-forcers 15, 16 operate opposed to the second pair of Y-forcers 17, 18, a torque about the Z axis is also produced. To produce a force in the Z direction, all of the forcers 11–18 produce their Z forces in unison. Torques about the X and Y axis may be produced by operating the first pair of Y-forcers 15, 16 to produce forces in the Z direction in unison with the first pair of X-forcers 11, 12 and opposed to the second pair of Y-forcers 17, 18 and the second pair of X-forcers 13, 14 or by operating the first pair of X-forcers in to produce forces in the Z direction in unison with the second pair of Y-forcers and opposed to the second pair of X-forcers and the first pair of Y-forcers, respectively.

By combining the forces produced in the manner described above, the position and velocity of the moving part 2 of the planar motor may be controlled in all six degrees of freedom (namely in each of the X, Y and Z directions and about axes parallel to each of the X, Y and Z directions). The Z-direction forces of the forcers 11–18 are used to bear the weight of the moving part 2 of the apparatus, thus obviating the requirement for a separate bearing. As shown in FIG. 2, the planar motor operates with the X and Y axis of the moving part 2 at approximately 45° to the orientation of the rows 6 and columns 7 of the permanent magnets of the stationary part 1.

However, in addition to the forces in the Z direction and one of the X and Y direction, each of the forcers 11–18 also produces a spurious torque. The X-forcers produce a torque about the Y axis and the Y-forcers produce a torque about the X axis. The torque produced is a function of the force produced by the forcer in the Z direction, the force produced by the forcer in the X or Y direction and the position of a forcer in the X or Y direction. This spurious torque component is referred to as "pitch torque".

The X and Y forcers are provided in pairs in the presently known design of planar motors to counter the effect of the pitch torque. To affect this, each of the forcers in a pair is offset by an amount $\tau/2$. The positional offset is set to be one half of the pitch $\tau$ of the arrangement of the permanent magnets of the stationary part 1 of the planar motor (i.e. half of the distance between the diagonal lines of permanent magnets that are oriented in the same manner, as shown in FIG. 2). Setting the positional offset to this distance $\tau/2$ results in the pitch torque produced by one forcer of a pair precisely offsetting the pitch torque produced by the other forcer of the pair. Therefore the net pitch torque within each pair is zero.

Providing the forcers in pairs is, however, disadvantageous. It doubles the number of forcers required, which increases the mass of the moving part of the planar motor and increases its size in the X-Y plane. This also increases the number of 3-phase amplifiers required (a 90° phase shift is required between the 3-phase current system of forcer pairs so each pair of forcers requires two 3-phase amplifiers) as well as the complexity of the control system.

SUMMARY OF THE INVENTION

It is an aspect of the present invention to provide a device manufacturing method for use with a lithographic apparatus in which compensation for pitch torque can be effected without the use of additional forcers and amplifiers.

This and other aspects are achieved according to the present invention in a device manufacturing method including providing a substrate that is at least partially covered by a layer of radiation-sensitive material; providing a beam of radiation using a radiation system; using a patterning device to endow the beam with a pattern in its cross-section;

projecting the patterned beam of radiation onto a target portion of the layer of radiation-sensitive material; positioning one of the substrate and the patterning device with a planar motor; the planar motor comprised of a plurality of coil-sets, each producing at least one primary force in a given direction and at least one spurious torque, associated with the primary force, to a moving part of the planar motor, determining the primary forces required to position the planar motor, determining a correction for each of the required primary forces such that the effect of the corrections at least partially compensates for the sum of the spurious torques on the moving part of the planar motor, and providing control signals to the coil-sets to effect the primary forces including the corrections.

This method represents an entirely different mechanism for dealing with pitch torques to the presently known techniques. It is advantageous in that it provides an opportunity to reduce the effect of pitch torque produced by the coil-sets in a planar motor without requiring additional, compensatory, coil-sets on the moving part of the planar motor. It can therefore be tuned by adjusting control parameters rather than by having to make physical alterations to the equipment.

In particular, the correction may be derived from the required primary forces rather than monitoring the difference between the required motion and the observed motion and deriving the correction from this motion. This significantly reduces the overall error in the motion.

The spurious torques that are compensated for in this method are, especially, those which are generated by each coil-set and act about an axis that is perpendicular to the direction of a primary force produced by the coil-set and parallel to the plane of the coils within the coil-set.

Determining the corrections may be performed by calculating the spurious torques that would be caused by the required primary forces being applied by the coil-sets without the corrections and then determining the combination of supplementary primary forces in the coil-sets that produces torques on the moving part of the planar motor that are equal and opposite to the sum of the spurious torques. These supplementary forces are then used as the corrections.

This procedure for compensating for pitch torques significantly reduces the effect of pitch torque using straightforward control commands.

Alternatively, determining the corrections may be performed by determining correction forces for each of the required primary forces such that, when the sum of the correction forces and the required primary forces are applied by the coil-sets, the sum of the effect of the primary forces and spurious torques substantially equals the forces and torques required to effect the positioning.

This procedure for producing the offset is particularly beneficial since it substantially eliminates the effect of the spurious pitch torques.

According to a further aspect of the invention there is provided a computer program for controlling a lithographic projection apparatus, the computer program comprising codes for instructing the apparatus to: position one of the substrate and the patterning device with a planar motor, the planar motor comprised of a plurality of coil-sets, each producing at least one primary force in a given direction and at least one spurious torque, associated with the primary force, to a moving part of the planar motor; determine the primary forces required to position the planar motor; determine a correction for each of the required primary forces such that the effect of the corrections at least partially compensates for the sum of the spurious torques on the moving part of the planar motor; and provide control signals to the coil-sets to effect the primary forces including the corrections.

According to a further aspect of the invention there is provided a lithographic projection apparatus comprising: a radiation system constructed and arranged to provide a beam of radiation; a support structure constructed and arranged to support a patterning device, the patterning device constructed and arranged to pattern the beam according to a desired pattern; a substrate table constructed and arranged to hold a substrate; a projection system constructed and arranged to project the patterned beam onto a target portion of the substrate; and a planar motor constructed and arranged to position one of the patterning device and the substrate table, the planar motor including a plurality of coil-sets, each producing at least one primary force in a given direction and at least one spurious torque, associated with the primary force, to the a moving part of the planar motor; and a controller that determines the primary forces required to position the planar motor, determines a correction for each of the required primary forces such that the effect of the correction attenuates the sum of the spurious torques on the moving part of the planar motor, and provides a control signal to each of the coil-sets to apply the sum of the required primary forces and the corrections at each coil-set.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding Preference symbols indicate corresponding parts.

DETAILED DESCRIPTION

Figure 1:
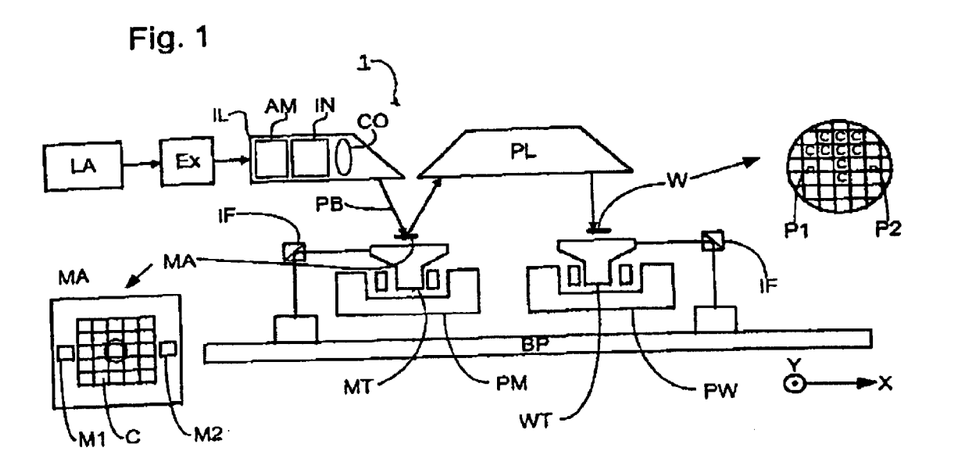
FIG. 1 depicts a lithographic projection apparatus according to an embodiment of the invention.

FIG. 1 schematically depicts a lithographic projection apparatus 1 according to an embodiment of the invention. The apparatus 1 includes a base plate BP; a radiation system Ex, IL constructed and arranged to supply a beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to: a step and scan apparatus) the mask table MT may just be connected to a short stroke actuator, or maybe fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 5:
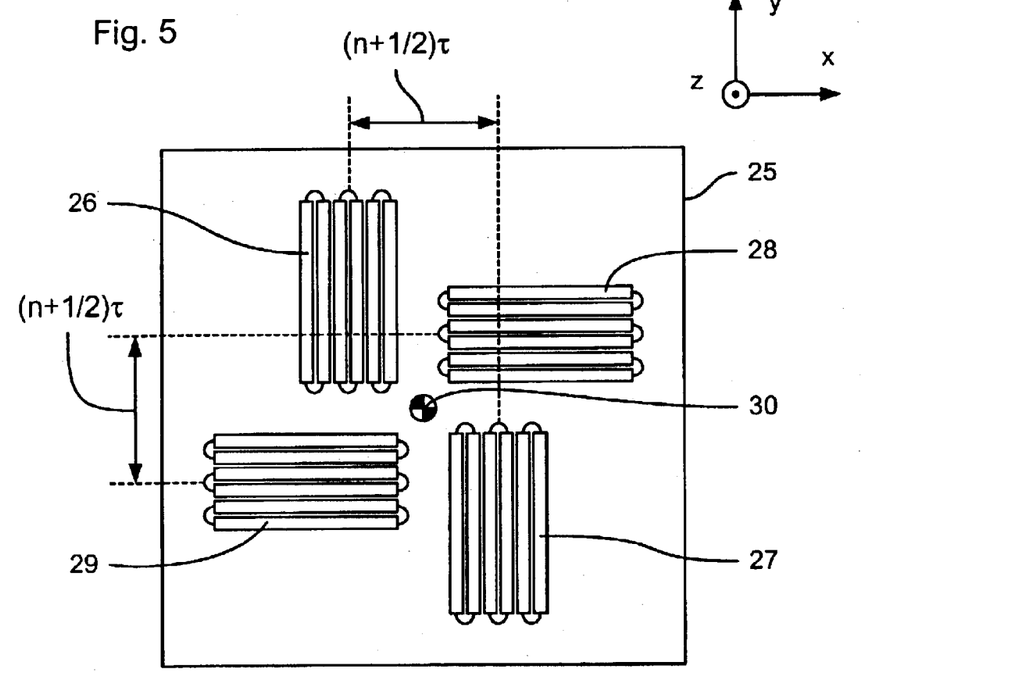
FIG. 5 depicts the moving part of a planar motor according to a first exemplary embodiment of the present invention.
Figure 6:
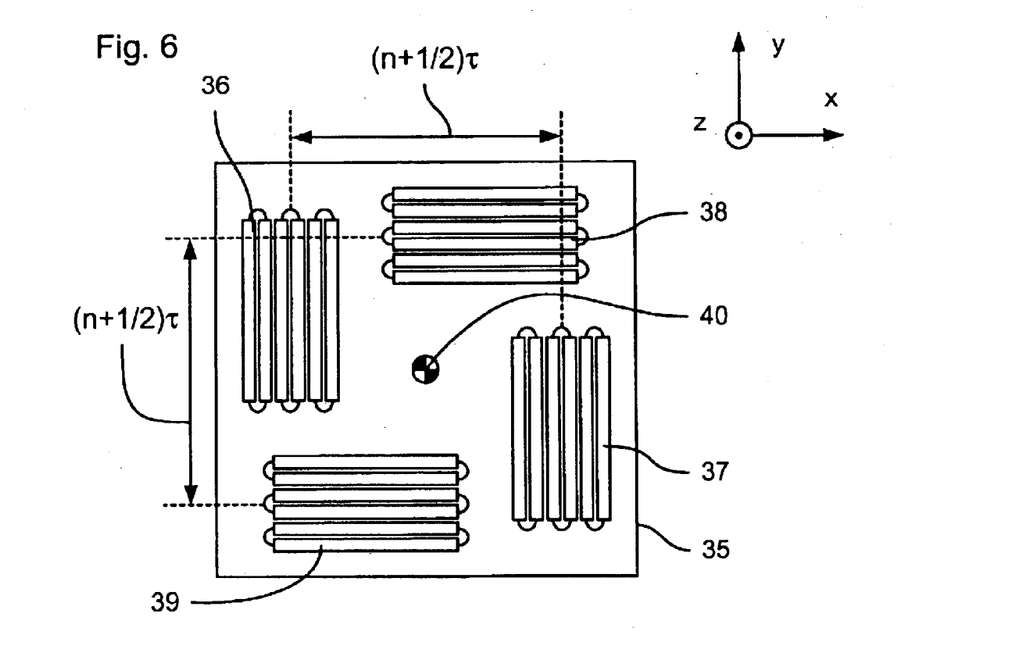
FIG. 6 depicts the moving part of a planar motor according to another exemplary embodiment of the present invention.

FIGS. 5 and 6 depict first and second exemplary arrangements, respectively, for the moving part 25; 35 of a planar motor according to the present invention. The forcers 26–29; 36–39 are not arranged in pairs as in the known design shown in FIGS. 2–4. In FIG. 5, for example, there are two individual X-forcers 26, 27 which, operating in unison, produce forces in the X direction and, operating opposed to one another, produce torques around the Z axis. There are two Y-forcers 28, 29 which, when operating in unison, produce forces in the Y direction and, when operating opposed to one another, produce torques about the Z axis. When the first X-forcer 26 produces a force in the Z direction in unison with the first Y-forcer 28 and opposed to the second X-forcer 27 and the second Y-forcer 29, a torque about the X axis is produced. When the first X-forcer 26 produces a force in the Z direction in unison with the second Y-forcer 29 and opposite to the second X-forcer 27 and the first Y-forcer 28, a torque about the Y axis is produced. The control of the moving part 35 shown in FIG. 6 is similar but the arrangement of the forcers 36–38 is consolidated.

However, since the forcers are not arranged in pairs, the pitch torque is not intrinsically compensated. The X-forcers generate a pitch torque Ty which is dependent on the force Fx produced by the forcer in the X direction, the force Fz produced in the Z direction and the position of the forcer in the X direction. Similarly the Y-forcers produce a pitch torque Tx which is dependent on the force Fy produced by the forcer in the Y direction, the force Fz produced by the forcer in the Z direction and the position of the forcer in the Y direction.

The pitch torques can be described by the following equations.

$$Ty_{x1} = C_1 \cdot Fx_{x1} \cdot \sin\left(\frac{2\cdot\pi\cdot x}{\tau}\right) + C_2 \cdot Fz_{x1} \cdot \sin\left(\frac{2\cdot\pi\cdot x}{\tau} + \frac{\pi}{2}\right); \quad (1)$$

$$Ty_{x2} = -C_1 \cdot Fx_{x2} \cdot \sin\left(\frac{2\cdot\pi\cdot x}{\tau}\right) - C_2 \cdot Fz_{x2} \cdot \sin\left(\frac{2\cdot\pi\cdot x}{\tau} + \frac{\pi}{2}\right); \quad (2)$$

$$Tx_{y1} = C_1 \cdot Fy_{y1} \cdot \sin\left(\frac{2\cdot\pi\cdot y}{\tau}\right) + C_2 \cdot Fz_{y1} \cdot \sin\left(\frac{2\cdot\pi\cdot y}{\tau} + \frac{\pi}{2}\right); \quad (3)$$

and $$Tx_{y2} = -C_1 \cdot Fy_{y2} \cdot \sin\left(\frac{2\cdot\pi\cdot y}{\tau}\right) - C_2 \cdot Fz_{y2} \cdot \sin\left(\frac{2\cdot\pi\cdot y}{\tau} + \frac{\pi}{2}\right), \quad (4)$$

wherein $Ty_x$ represents the y pitch torque caused by the first X-forcer 26, 36 and the second X-forcer 27; 37; $Tx_y$ represents the x pitch torque caused by the first Y-forcer 28; 38 and the second Y-forcer 29; 39; $Fx_x$ represents the x force generated by the first X-forcer 26; 36 and the second X-forcer 27;37; $Fy_y$ represents the y force generated by the first Y-forcer 28; 38 and the second Y-forcer 29; 39; $Fz$ represents the z force generated by the X- and Y-forcers 26–29; 36–39; x represents the position, in the X direction, of the moving part of the planar motor relative to a predetermined position on the stationary part; y represents the position, in the Y direction, of the moving part of the planar motor relative to a predetermined position on the stationary part; C1 and C2 represent constants which are typical for the planar motor which are dependent, for example, on its geometry and the pitch of the magnets; and τ represents the pitch of the primary permanent magnets.

From these equations, the total pitch torque on the moving part 25; 35 of the planar motor can be calculated.

$$Ty_{tot} = C_1 \cdot (Fx_{x1} - Fx_{x2}) \cdot \sin\left(\frac{2\cdot\pi\cdot x}{\tau}\right) + \\ C_2 \cdot (Fz_{x1} - Fz_{x2}) \cdot \sin\left(\frac{2\cdot\pi\cdot x}{\tau} + \frac{\pi}{2}\right); \text{ and} \quad (5)$$

$$Tx_{tot} = C_1 \cdot (Fy_{y1} - Fy_{y2}) \cdot \sin\left(\frac{2\cdot\pi\cdot y}{\tau}\right) + \\ C_2 \cdot (Fz_{y1} - Fz_{y2}) \cdot \sin\left(\frac{2\cdot\pi\cdot y}{\tau} + \frac{\pi}{2}\right) \quad (6)$$

From the equations for the total pitch torques $Ty_{tot}$, $Tx_{tot}$ (equations (5) and (6)), it can be seen that when, as in the configurations shown in FIGS. 5 and 6, the X-forcers and Y-forcers, respectively, are arranged with a shift of (n+½)τ, pitch torques are not produced when the force components in the X-forcers are the same and the force components in the Y-forcers are the same ($Fx_{x1}=Fx_{x2}$, $Fy_{y1}=Fy_{y2}$, $Fz_{x1}=Fz_{x2}$, and $Fz_{y1}=Fz_{y2}$). In other words, pitch torques are not generated when the X-forcers 26, 27 operate in unison and the Y-forcers 28, 29 operate in unison. This occurs when the overall required force on the moving part of the planar motor is a force in the X direction, a force in the Y direction, a force in the Z direction or some combination of these. However, pitch torques are generated when the force components in the X-forcers 26, 27 differ and/or when the force components in the Y-forcers 28, 29 differ. This occurs when torques about any of the X, Y and Z axis are required for the moving part 25 of the planar motor, for example, during acceleration.

For a given combination of forces and torques that are required to be applied to the moving part 25 of the planar motor, equations (5) and (6) can be used to determine the pitch torque that will be produced. A compensatory torque can then be calculated and forces applied to each of the forces to produce this compensatory torque.

The apparatus 1 may be controlled by a controller. The controller may be implemented on a programmed general purpose computer. The controller may also be implemented on a special purpose computer, a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA or PAL, or the like. In general, any device, capable of implementing a finite state machine that is in turn capable of implementing the methods described, can be used to implement the controller.

Figure 7:
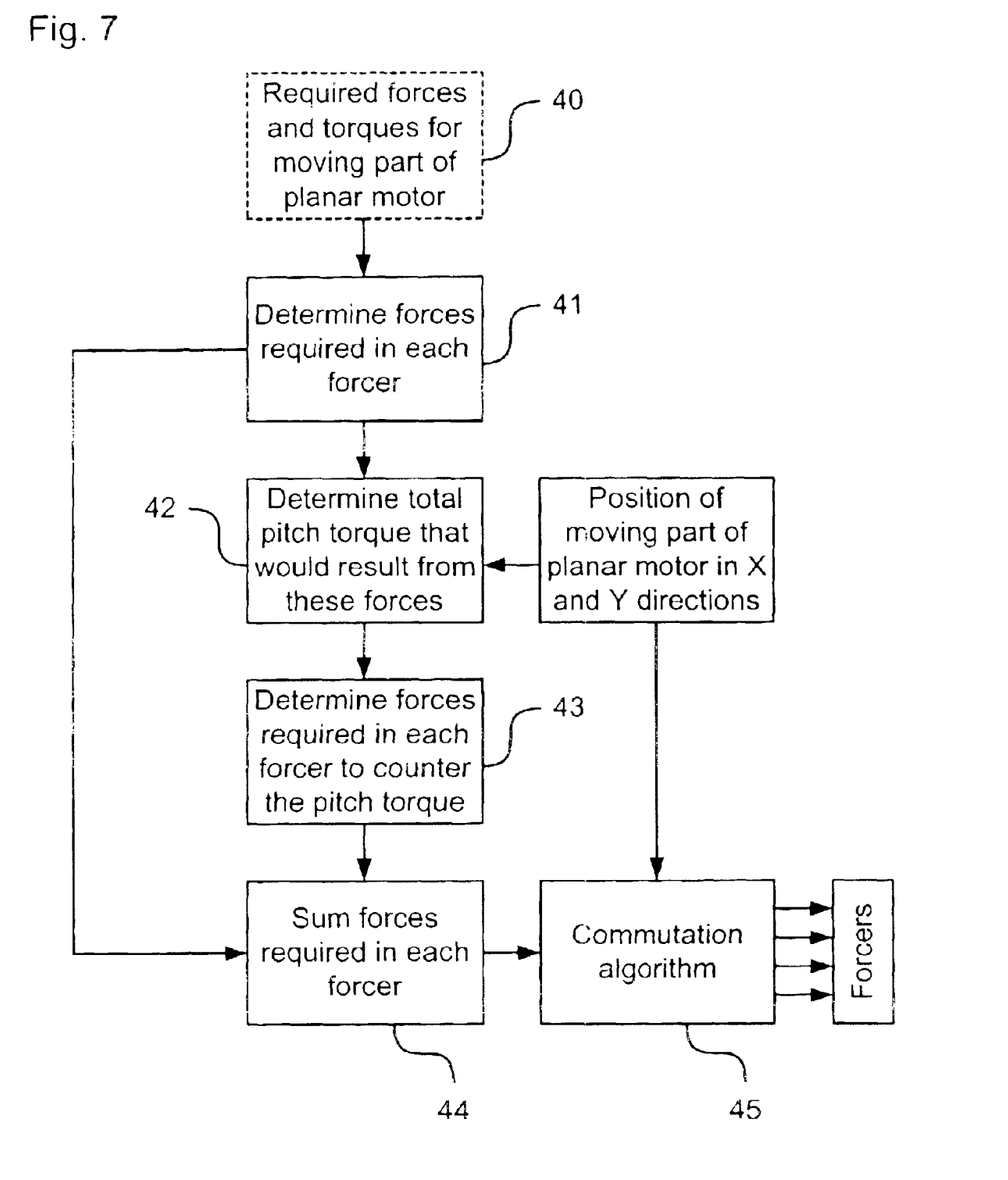
FIG. 7 represents an element of the control system of a planar motor according to a first exemplary embodiment of the present invention.

Referring to FIG. 7, a controller may include a computer program including codes that instruct the apparatus to perform functions. A code 40 instructs the apparatus 1 to determine the required forces and torques for the moving part of the planar motor, and from these, the forces required in each forcer are calculated by a code 41. A code 42 instructs the apparatus to calculate the total pitch torque on the moving part of the planar motor engendered by producing the forces in the forcers. A code 43 instructs the apparatus 1 to calculate the forces required in each forcer to offset the pitch torque. These offset forces are added, as instructed by a code 44, to the forces that would have been required in each forcer without the pitch torque effect. A commutation algorithm 45 then instructs the apparatus 1 to determine the currents that need to be applied to each of the three phases of each of the four forcers to produce the required forces in each forcer.

Although the offset forces which are required to compensate for the pitch torque themselves produce further pitch torques, the amplitude is substantially lower than the initial pitch torque for the configurations shown in FIGS. 5 and 6. An iterative process may be used in which subsequent offset forces are determined to counteract the pitch torques produced by the previously determined offsets. The process can be repeated until the resultant pitch torques are below a given threshold value. One should note, however, that as the moment arm between the point of effect of the first and second X-forcers and the first and second Y-forcers decreases, the benefit of this form of pitch torque compensation decreases.

Table 1 shows a comparison of the torques produced in a planar motor with the moving part 25 arranged as shown in FIG. 5, with and without pitch torque compensation such as that described above. As shown, the compensation significantly reduces the error on the required torque.

TABLE 1

Deviations of the desired torque with and without compensation.

| | Uncompensated max/min | | Compensated max/min | |
|---|---|---|---|---|
| T desired | Tx, actual [Nm] | Ty, actual [Nm] | Tx, actual [Nm] | Ty, actual Nm] |
| Tx = 1 Nm | 1.03/0.97 | 0.066/−0.066 | +1.003/+0.995 | +5e−4/−4e−3 |
| Ty = 1 Nm | 0.066/−0.066 | 1.03/0.97 | +4e−3/−5e−4 | +1.003/+0.995 |
| Tz = 1 Nm | +4e−2/−4e−2 | +4e−2/−4e−2 | +3e−3/−3e−3 | +3e−3/−3e−3 |
| Tx = Ty = Yz = 1 Nm | 1.054/0.946 | 1.104/0.896 | 1.008/0.994 | 1.002/0.993 |

Figure 8:
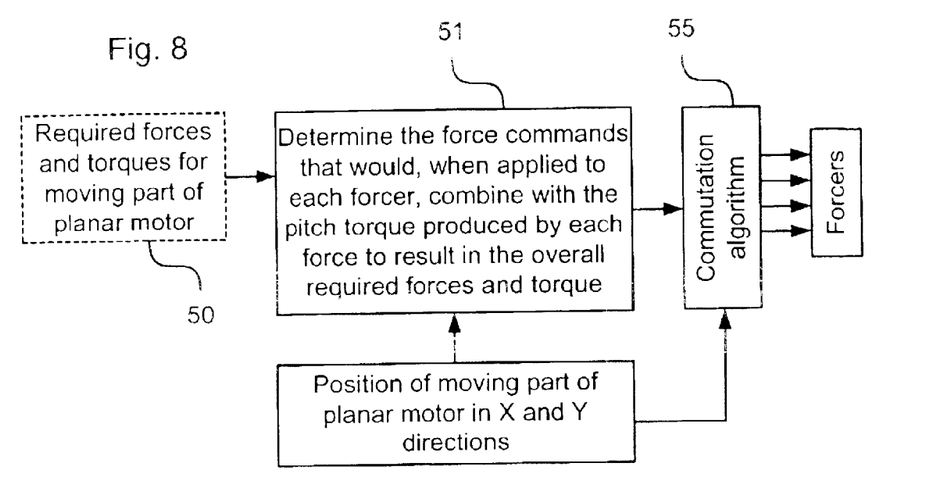
FIG. 8 represents an element of the control system of a planar motor according to a second exemplary embodiment of the present invention.

FIG. 8 shows a controller according to a second embodiment of the present invention for compensating for the pitch torques produced in the forcers. A code 50 instructs the apparatus to calculate the required forces and torques for the moving part of the planar motor. A code 51 instructs the apparatus to determine the primary force commands that should be applied to the forcers such that, when the primary forces are combined with the parasitic pitch torques that are produced with the primary forces, the sum is equal to the required forces and torques in the moving part of the planar motor determined by code 50. The primary force commands are then applied to a commutation algorithm 55 which provides the required currents to the three phases of each of the four forcers.

In order to determine the primary forces as instructed by code 51, some mathematical modeling is required. The following equation models the moving part of the planar motor in the ideal situation, with no pitch torques. In order to provide a unique solution, the model requires that the force, components in the Z-direction of the X-forcers provide half of the total force in the Z-direction and that the force components in the X-direction of the X-forcers provides half of the total torque about the Z-axis. This embodiment of the invention may also be implemented with other models, which use different assumptions, provided the determinant of the equivalent characteristic matrix shown in the equation below is non-zero.

$$\begin{bmatrix} Fx \\ Fy \\ Fz \\ Tx \\ Ty \\ Tz \\ 0.5 \cdot Fz \\ 0.5 \cdot Tz \end{bmatrix} = \begin{bmatrix} 1 & 1 & 0 & 0 & 0 & 0 & 0 & 0 \\ 0 & 0 & 1 & 1 & 0 & 0 & 0 & 0 \\ 0 & 0 & 0 & 0 & 1 & 1 & 1 & 1 \\ 0 & 0 & -z & -z & -y_{x1} & y_{x1} & y_{y1} & -y_{y1} \\ z & z & 0 & 0 & -x_{x1} & x_{x1} & -y_{y1} & y_{y1} \\ y_{x1} & -y_{x1} & x_{y1} & -x_{y1} & 0 & 0 & 0 & 0 \\ 0 & 0 & 0 & 0 & 1 & 1 & 0 & 0 \\ y_{x1} & -y_{x1} & 0 & 0 & 0 & 0 & 0 & 0 \end{bmatrix} \cdot \begin{bmatrix} Fx_{x1} \\ Fx_{x2} \\ Fy_{y1} \\ Fy_{y2} \\ Fz_{x1} \\ Fz_{x2} \\ Fz_{y1} \\ Fz_{y2} \end{bmatrix} \quad (7)$$

Fx, Fy and Fz are the total forces on the movable part of the planar motor, namely the required forces. Tx, Ty and Tz are the torques produced on the moving part of the planar motor about the respective axes, namely the required torques. As before, Fx_ represents the force produced by the denoted forcer (x1 or x2) in the X direction, Fy_ represents the force produced by the denoted forcer (y1 or y2) in the Y direction and Fz represents the force produced by the denoted forcer (x1, x2, y1 or y2) in the Z direction. The coordinates of the points of action of the forcers with respect to the center of mass 30; 40 of the moving part 25; 35 of the planar motor, are given by x, y or z with a subscript denoting the forcer ($x_1$, $x_2$, $y_1$ or $y_2$). In this model, it is assumed that the positions, in the Z-direction of all the points of action of all of the forcers, relative to the center of mass 30; 40, are the same. It is also assumed that $x_{x1}=x_{x2}$, $y_{x1}=y_{x2}$, $x_{y1}=x_{y2}$ and $y_{y1}=y_{y2}$. Both these assumptions are not essential features of the present embodiment of the invention but are preferable as they reduce the complexity of the calculations.

When the pitch torques are introduced into the model, the equation becomes $$\begin{bmatrix} Fx \\ Fy \\ Fz \\ Tx \\ Ty \\ Tz \\ 0.5 \cdot Fz \\ 0.5 \cdot Tz \end{bmatrix} = \begin{bmatrix} 1 & 1 & 0 & 0 & 0 & 0 & 0 & 0 \\ 0 & 0 & 1 & 1 & 0 & 0 & 0 & 0 \\ 0 & 0 & 0 & 0 & 1 & 1 & 1 & 1 \\ 0 & 0 & -z+\varphi & -z-\varphi & -y_{x1} & y_{x1} & y_{y1}+\theta & -y_{y1}-\theta \\ z+\alpha & z-\alpha & 0 & 0 & -x_{x1}+\beta & x_{x1}-\beta & -x_{y1} & x_{y1} \\ y_{x1} & -y_{x1} & x_{y1} & -x_{y1} & 0 & 0 & 0 & 0 \\ 0 & 0 & 0 & 0 & 1 & 1 & 0 & 0 \\ y_{x1} & -y_{x1} & 0 & 0 & 0 & 0 & 0 & 0 \end{bmatrix} \cdot \begin{bmatrix} Fx_{x1} \\ Fx_{x2} \\ Fy_{y1} \\ Fy_{y2} \\ Fz_{x1} \\ Fz_{x2} \\ Fz_{y1} \\ Fz_{y2} \end{bmatrix}, \quad (8)$$

wherein $$\varphi = C_1 \cdot \sin\left(\frac{2 \cdot \pi \cdot y}{\tau}\right); \quad (9)$$

$$\theta = C_2 \cdot \sin\left(\frac{2 \cdot \pi \cdot y}{\tau} + \frac{\pi}{2}\right); \quad (10)$$

-continued $$\alpha = C_1 \cdot \sin\left(\frac{2 \cdot \pi \cdot x}{\tau}\right); \text{ and} \quad (11)$$

$$\beta = C_2 \cdot \sin\left(\frac{2 \cdot \pi \cdot x}{\tau} + \frac{\pi}{2}\right); \quad (12)$$

The pitch torque components φ, θ, α and β are the same as those discussed before with reference to the first embodiment.

This model allows determination of the forces, $Fx_{x1}$ through $Fz_{y2}$, required in each forcer to produce the required forces and torques Fx through Tz on the moving part of the planar motor as a whole. By inverting the 8 by 8 matrix of equation (8) we arrive at the following equation, from which the required primary forces for each forcer can be determined from the overall forces and torques required for the moving part of the planar motor.

A third way to compensate for the pitch torques produced by the forces is to provide a learning algorithm, such as a neural network, that can be trained to provide the correct force commands for each of the forces (or, directly, the requisite three phase currents for each forcer) to produce the overall required force and torques on the moving part of the planar motor.

Figure 9:
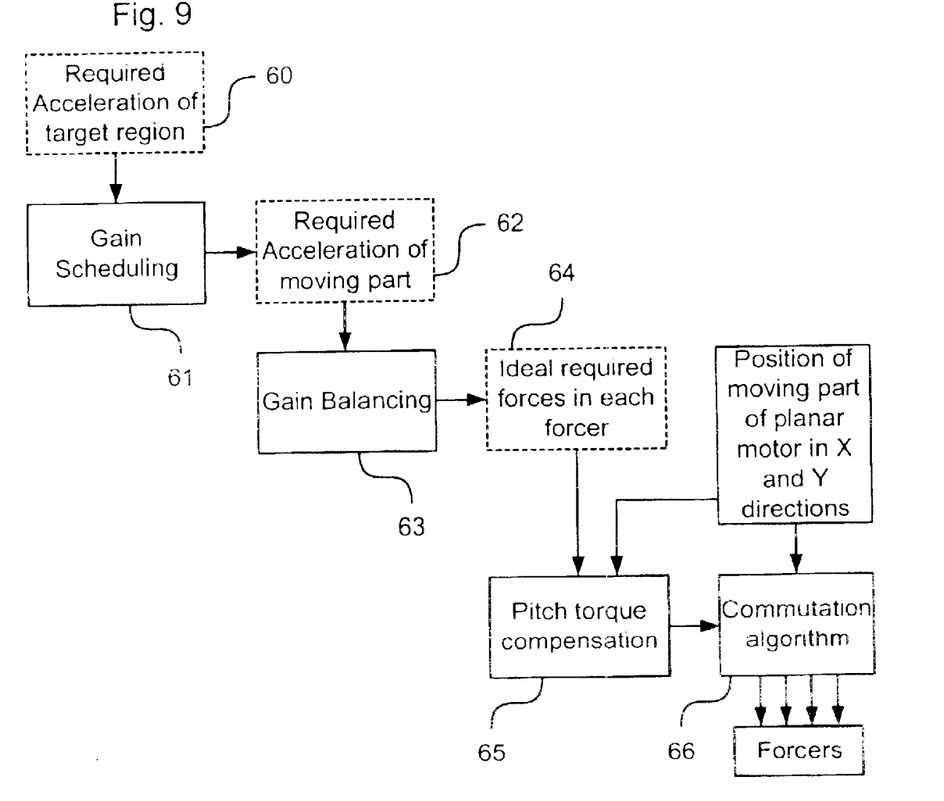
FIG. 9 represents further elements of the control system of a planar motor according to the present invention.

In all of the above embodiments, the pitch torque compensation is only a part of the control system required to control the moving part of the planar motor. FIG. 9 depicts a controller according to a third embodiment including a $$\begin{bmatrix} Fx_{x1} \\ Fx_{x2} \\ Fy_{y1} \\ Fy_{y2} \\ Fz_{x1} \\ Fz_{x2} \\ Fz_{y1} \\ Fz_{y2} \end{bmatrix} = \frac{1}{2} \cdot \begin{bmatrix} 1 & 0 & 0 & 0 & 0 & 0 & 0 & \frac{1}{y_{x1}} \\ 1 & 0 & 0 & 0 & 0 & 0 & 0 & -\frac{1}{y_{x1}} \\ 0 & 1 & 0 & 0 & 0 & \frac{1}{x_{y1}} & 0 & -\frac{1}{x_{y1}} \\ 0 & 1 & 0 & 0 & 0 & -\frac{1}{x_{y1}} & 0 & \frac{1}{x_{y1}} \\ z \cdot \frac{y_{y1}+\theta}{D} & -z \cdot \frac{x_{y1}}{D} & 0 & -\frac{x_{y1}}{D} & -\frac{y_{y1}+\theta}{D} & \frac{\varphi}{D} & 1 & \frac{(-y_{x1} \cdot \varphi + y_{y1} \cdot \alpha + \theta \cdot \alpha)}{y_{x1} \cdot D} \\ -z \cdot \frac{y_{y1}+\theta}{D} & z \cdot \frac{x_{y1}}{D} & 0 & \frac{x_{y1}}{D} & \frac{y_{y1}+\theta}{D} & -\frac{\varphi}{D} & 1 & -\frac{(-y_{x1} \cdot \varphi + y_{y1} \cdot \alpha + \theta \cdot \alpha)}{y_{x1} \cdot D} \\ z \cdot \frac{y_{x1}}{D} & z \cdot \frac{(x_{x1}-\beta)}{D} & 1 & \frac{(x_{x1}-\beta)}{D} & -\frac{y_{x1}}{D} & -\varphi \cdot \frac{(x_{x1}-\beta)}{(x_{y1} \cdot D)} & -1 & \frac{(\alpha \cdot y_{x1} + \varphi \cdot x_{x1} - \varphi \cdot \beta)}{x_{y1} \cdot D} \\ -z \cdot \frac{y_{x1}}{D} & -z \cdot \frac{(x_{x1}-\beta)}{D} & 1 & -\frac{(x_{x1}-\beta)}{D} & \frac{y_{x1}}{D} & \varphi \cdot \frac{(x_{x1}-\beta)}{(x_{y1} \cdot D)} & -1 & -\frac{(\alpha \cdot y_{x1} + \varphi \cdot x_{x1} - \varphi \cdot \beta)}{x_{y1} \cdot D} \end{bmatrix} \cdot \begin{bmatrix} Fx \\ Fy \\ Fz \\ Tx \\ Ty \\ Tz \\ 0.5 \cdot Fz \\ 0.5 \cdot Tz \end{bmatrix}, \quad (13)$$

wherein $$D = (y_{x1} \cdot x_{y1} - \beta \cdot \theta + x_{x1} \cdot y_{y1} + x_{x1} \cdot \theta - \beta \cdot y_{y3}) \quad (14).$$

The number of calculations required to determine the forces required in each of the forcers may be reduced by spotting that many of the terms in the computation for each of the X and Y forcers are simply the negative of the term for the other of the X or Y forcers. φ, θ, α and β (and therefore D) are all dependent on the position of the moving part of the planar motor and therefore must be updated as the motor operates.

All of the calculations to find the required forces in each of the forcers may be performed each time the force calculations are updated. Alternatively some of the calculations, such as the values of φ, θ, α and β (in which the only variable is the position of the moving part of the planar motor relative to the stationary part) may be pre-calculated for a range of positions and stored in a memory. The remaining calculations are performed using the appropriate value from a memory. The range of positions for which values would be required would simply be the range of the centroid of the moving part of the planar motor relative to one of the magnets in the stationary part. Other positions of the moving part of the planar motor have the same values of φ, θ, α and β when the centroid is in the same relative position to another magnet in the stationary part that is oriented with is magnetic polarization parallel to that of the first magnet.

code 60 that instructs the apparatus to determine the required accelerations (both straight line and rotational) of a target region on the mask or substrate, mounted on the moving part of the planar motor. A code 61 instructs the apparatus 1 to perform a process referred to as "gain scheduling." A code 62 then instructs the apparatus to determine the required acceleration of the moving part of the planar motor in order to produce the required acceleration of the target region. A code 63 instructs the apparatus to perform a process referred to as "gain balancing." A code 64 then instructs the apparatus to determine the forces and torques for the moving part of the planar motor.

The gain balancing process takes into account the forces, other than those produced by the forcers, on the middle part of the planar motor. These forces may, for example, include the weight of the moving part of the planar motor, and external forces such as the cable arm. The gain balancing may also take into account the position of the point of action of each force produced by the forcers. The product of the gain balancing process is the ideal required force determined by code 64 for each forcer. However, this does not take account of the pitch torque. Therefore, a code 65 instructs the apparatus to determine the pitch torque compensation. The real forces required in each forcer are then provided to a communication algorithm 66 which determines the required currents for each of the three phases for each of the four forces. Further information on gain scheduling may be found in U.S. application Ser. No. 10/360,989, field Feb. 10, 2003, the entire contents of which are herein incorporated by reference.

The pitch torque compensation may be provided by any of the methods described above. For example, in the first embodiment codes 42–44, as shown in FIG. 7, may be used. In the second embodiment, equation (13) already takes into account the position of the point of action of the forcers. The gain balancing therefore need only take account of the other forces acting on the moving part of the planar motor and determine the required overall forces and torques for the moving part as a whole. Alternatively, it may be desirable to perform standard gain balancing, the product of which is the required forces in each forcer, and from this determine the required force commands that should be provided to the forcers to compensate for the pitch torques. To effect this by the method of the second embodiment, some further processing is required. For simplicity, equation (7) above may be rewritten as:

$$\begin{bmatrix} Fx \\ Fy \\ Fz \\ Tx \\ Ty \\ Tz \\ 0.5 \cdot Fz \\ 0.5 \cdot Tz \end{bmatrix} = [A_{ideal}] \cdot [F_{ideal}], \quad (15)$$

wherein $[A_{ideal}]$ is the 8×8 matrix modelling the ideal relationship (i.e. not incorporating pitch torque) between the overall forces and torques on the moving part of the planar motor and the forces in each of the forces. Similarly equation (8) above can be rewritten as $$\begin{bmatrix} Fx \\ Fy \\ Fz \\ Tx \\ Ty \\ Tz \\ 0.5 \cdot Fz \\ 0.5 \cdot Tz \end{bmatrix} = [A_{real}] \cdot [F_{real}], \quad (16)$$

wherein $[A_{real}]$ is the 8×8 matrix incorporating the pitch torques into the model. Combining these two equations and rearranging, the following equation is produced $$[F_{real}] = [A_{real}]^{-1}[A_{ideal}][F_{ideal}] \quad (17).$$

Figure 10:
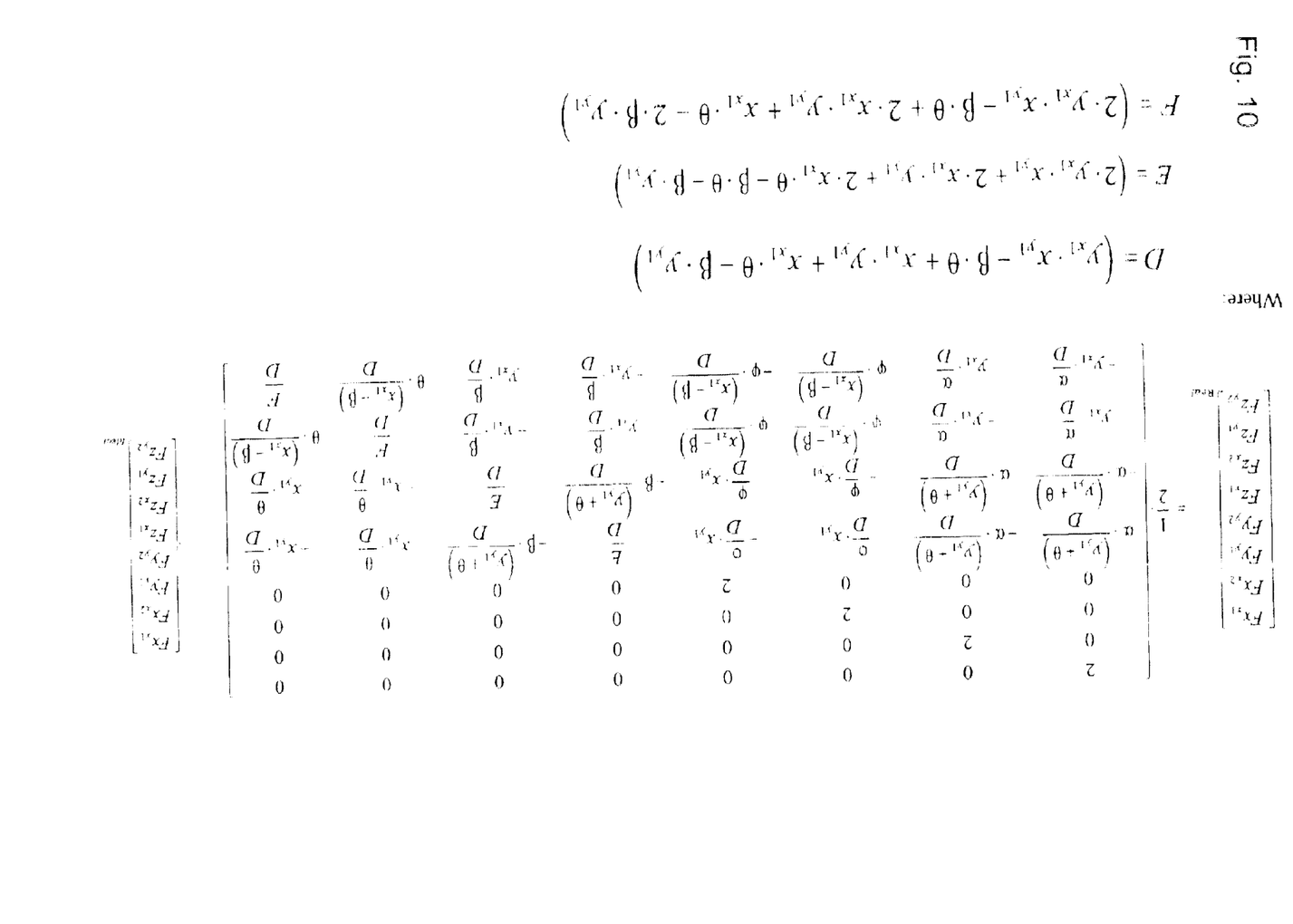
FIG. 10 shows an equation for use in compensating for the pitch torques.

The relationship between the real forces $[F_{real}]$ that must be provided to the forcers, taking account of the pitch torques, and the ideal forces $[F_{ideal}]$ that are determined in the gain balancing. For convenience, the expanded version of equation (17) is shown as FIG. 10 on the accompanying drawings. Again, the amount of computation required is reduced by the fact that many of the terms for each of the forces required in the X and Y forcers are the negative of the terms required for the other of the X and Y forcers. As before, φ, θ, α and β (and hence D) are dependent on the position of the moving part of the planar motor and therefore need to be updated as the motor operates.

While specific embodiments of the invention have been described above, it will be appreciated that the invention may be practiced otherwise than as described. The description is not intended to limit the invention.

What is claimed is:

1. A device manufacturing method, comprising:

providing a substrate that is at least partially covered by a layer of radiation-sensitive material;

providing a beam of radiation using a radiation system;

using a patterning device to endow the beam with a pattern in its cross-section;

projecting the patterned beam of radiation onto a target portion of the layer of radiation-sensitive material, positioning one of the substrate and the patterning device with a planar motor; the planar motor includes of a plurality of coil sets, each coil set producing at least one primary force in a given direction and at least one spurious torque, associated with the primary force, to a moving part of the planar motor;

calculating the primary forces required to position the planar motor at a predetermined position;

calculation the spurious torques associated with the calculated primary forces;

calculating a correction for each of the calculated primary forces such that the corrections at least partially compensate for the sum of the calculated spurious torques on the moving part of the planar motor; and providing control signals to the coil sets to effect the calculated primary forces including the corrections.

2. A device manufacturing method according to claim 1, wherein the correction is derived from the calculated primary forces.

3. A device manufacturing method according to claim 1, wherein the spurious torque generated by each coil set acts about an axis that is perpendicular to the direction of the at least one primary force produced by the coil set and parallel to the plane of coils within the coil set.

4. A device manufacturing method according to claim 1, wherein calculating the corrections comprises:

calculating the spurious torques that would be caused by the calculated primary forces being applied by the coil sets without the corrections;

calculating a combination of supplementary primary forces in the coil sets that produces torques on the moving part of the planar motor that are equal and opposite to the sum of the spurious torques; and using the supplementary forces as the corrections.

5. A device manufacturing method according to claim 1, wherein calculating the corrections comprises:

calculating correction forces for each of the calculated primary forces such that, when the sum of the correction forces and the calculated primary forces are applied by the coil sets, the sum of the effect of the calculated primary forces and spurious torques is substantially the forces and torques required to position the planar motor at the predetermined position.

6. A device manufacturing method according to claim 5, wherein calculating the required sum of the correction forces and the required primary forces is performed according to the equation:

$$\begin{bmatrix} Fx_{x1} \\ Fx_{x2} \\ Fy_{y1} \\ Fy_{y2} \\ Fz_{x1} \\ Fz_{x2} \\ Fz_{y1} \\ Fz_{y2} \end{bmatrix} = \frac{1}{2} \cdot \begin{bmatrix} 1 & 0 & 0 & 0 & 0 & 0 & 0 & \frac{1}{y_{x1}} \\ 1 & 0 & 0 & 0 & 0 & 0 & 0 & -\frac{1}{y_{x1}} \\ 0 & 1 & 0 & 0 & 0 & \frac{1}{x_{y1}} & 0 & -\frac{1}{x_{y1}} \\ 0 & 1 & 0 & 0 & 0 & -\frac{1}{x_{y1}} & 0 & \frac{1}{x_{y1}} \\ z \cdot \frac{y_{y1}+\theta}{D} & -z \cdot \frac{x_{y1}}{D} & 0 & -\frac{x_{y1}}{D} & -\frac{y_{y1}+\theta}{D} & \frac{\varphi}{D} & 1 & \frac{(-y_{x1} \cdot \varphi + y_{y1} \cdot \alpha + \theta \cdot \alpha)}{y_{x1} \cdot D} \\ -z \cdot \frac{y_{y1}+\theta}{D} & z \cdot \frac{x_{y1}}{D} & 0 & \frac{x_{y1}}{D} & \frac{y_{y1}+\theta}{D} & -\frac{\varphi}{D} & 1 & -\frac{(-y_{x1} \cdot \varphi + y_{y1} \cdot \alpha + \theta \cdot \alpha)}{y_{x1} \cdot D} \\ z \cdot \frac{y_{x1}}{D} & z \cdot \frac{(x_{x1}-\beta)}{D} & 1 & \frac{(x_{x1}-\beta)}{D} & -\frac{y_{x1}}{D} & -\varphi \cdot \frac{(x_{x1}-\beta)}{(x_{y1} \cdot D)} & -1 & \frac{(\alpha \cdot x_{y1} + \varphi \cdot x_{x1} - \varphi \cdot \beta)}{x_{y1} \cdot D} \\ -z \cdot \frac{y_{x1}}{D} & -z \cdot \frac{(x_{x1}-\beta)}{D} & 1 & -\frac{(x_{x1}-\beta)}{D} & \frac{y_{x1}}{D} & \varphi \cdot \frac{(x_{x1}-\beta)}{(x_{y1} \cdot D)} & -1 & -\frac{(\alpha \cdot x_{y1} + \varphi \cdot x_{x1} - \varphi \cdot \beta)}{x_{y1} \cdot D} \end{bmatrix} \cdot \begin{bmatrix} Fx \\ Fy \\ Fz \\ Tx \\ Ty \\ Tz \\ 0.5 \cdot Fz \\ 0.5 \cdot Tz \end{bmatrix}$$

wherein $$\varphi = C_1 \cdot \sin\left(\frac{2 \cdot \pi \cdot y}{\tau}\right);$$

$$\theta = C_2 \cdot \sin\left(\frac{2 \cdot \pi \cdot y}{\tau} + \frac{\pi}{2}\right);$$

$$\alpha = C_1 \cdot \sin\left(\frac{2 \cdot \pi \cdot x}{\tau}\right);$$

$$\beta = C_2 \cdot \sin\left(\frac{2 \cdot \pi \cdot x}{\tau} + \frac{\pi}{2}\right);$$

$D = (y_{x1} \cdot x_{y1} - \beta \cdot \theta + x_{x1} \cdot y_{y1} + x_{x1} \cdot \theta - \beta \cdot y_{y3});$ $Fx_{x\_}$ represents the force generated in a first direction, designated X, by a first X coil set x1 and a second X coil set x2;

$Fy_{y\_}$ represents the force generated in a second direction, perpendicular to the first direction and designated Y, by a first Y coil set y1 and a second Y coil set y2;

$Fz_{\_\_}$ represents a force generated in a third direction, perpendicular to the first and second directions and designated Z, by the X and Y coil sets x1, x2, y1 and y2;

C1 and C2 are constants for the specific planar motor;

x represents the position, in the X direction, of the moving part of the planar motor relative to a predetermined position on a stationary part;

y represents the position, in the Y direction, of the moving part of the planar motor relative to a predetermined position on the stationary part;

τ represents the pitch of the arrangement of permanent magnets used in the stationary part of the planar motor;

$x_{x1}$ represents the distance in the X direction between the point of action of the first X coil set x1 and the center of mass of the moving part of the planar motor and between the point of action of the second X coil set x2 and the center of mass of the moving part of the planar motor;

$x_{y1}$ represents the distance in the X direction between the point of action of the first Y coil set y1 and the center of mass of the moving part of the planar motor and between the point of action of the second Y coil set y2 and the center of mass of the moving part of the planar motor; $y_{x1}$ represents the distance in the Y direction between the point of action of the first X coil set x1 and the center of mass of the moving part of the planar motor and between the point of action of the second X coil set x2 and the center of mass of the moving part of the planar motor, $y_{y1}$ represents the distance in the Y direction between the point of action of the first Y coil set y1 and the center of mass of the moving part of the planar motor and between the point of the action of the second Y coil set y2 and the center of mass of the moving part of the planar motor;

z represents the distance in the Z direction between the point of action of all of the coil sets and the center of mass of the moving part of the planar motor;

Fx represents the force on the moving part of the planar motor required in the X direction to position the moving part of the planar motor;

Fy represents the force on the moving part of the planar motor required in the Y direction to position the moving part of the planar motor;

Fz represents the force on the moving part of the planar motor required in the Z direction to position the moving part of the planar motor;

Tx represents the torque on the moving part of the planar motor required about an axis parallel to the X direction to position the moving part of the planar motor;

Ty represents the torque on the moving part of the planar motor required about an axis parallel to the Y direction to position the moving part of the planar motor; and Tz represents the torque on the moving part of the planar motor required about an axis parallel to the Z direction to position the moving part of the planar motor.

7. A device manufacturing method according to claim 1, wherein in positioning the planar motor, only four coil-sets are used to provide the positioning force and the four coil-sets produce forces in two orthogonal directions parallel to a plane of the coil-sets.

8. A computer program for controlling a lithographic projection apparatus, the computer program comprising codes for instructing the apparatus to:

position one of a substrate and a patterning device with a planar motor; the planar motor including a plurality of coil sets, each coil set producing at least one primary force in a given direction and at least one spurious torque, associated with the primary force, to a moving part of the planar motor;

calculate the primary forces required to position the planar motor at a predetermined position;

calculate the spurious torques associated with the calculated primary forces;

calculate a correction for each of the calculated primary forces such that the effect of the corrections at least partially compensates for the sum of the calculated spurious torques on the moving part of the planar motor; and provide control signals to the coil sets to effect the primary forces including the corrections.

calculating a combination of supplementary primary forces in the coil sets that produces torques on the moving part of the planar motor that are equal and opposite to the sum of the spurious torques; and using the supplementary forces as the corrections.

12. A computer program according to claim 8, wherein calculating the corrections comprises:

calculating correction forces for each of the calculated primary forces such that, when the sum of the correction forces and the calculated primary forces are applied by the coil sets, the sum of the effect of the calculated primary forces and spurious torques is substantially the forces and torques required to position the planar motor at the predetermined position.

13. A computer program according to claim 12, wherein calculating the required sum of the correction forces and the required primary forces is performed according to the equation:

$$\begin{bmatrix} Fx_{x1} \\ Fx_{x2} \\ Fy_{y1} \\ Fy_{y2} \\ Fz_{x1} \\ Fz_{x2} \\ Fz_{y1} \\ Fz_{y2} \end{bmatrix} = \frac{1}{2} \cdot \begin{bmatrix} 1 & 0 & 0 & 0 & 0 & 0 & 0 & \frac{1}{y_{x1}} \\ 1 & 0 & 0 & 0 & 0 & 0 & 0 & -\frac{1}{y_{x1}} \\ 0 & 1 & 0 & 0 & 0 & \frac{1}{x_{y1}} & 0 & -\frac{1}{x_{y1}} \\ 0 & 1 & 0 & 0 & 0 & -\frac{1}{x_{y1}} & 0 & \frac{1}{x_{y1}} \\ z \cdot \frac{y_{y1}+\theta}{D} & -z \cdot \frac{x_{y1}}{D} & 0 & -\frac{x_{y1}}{D} & -\frac{y_{y1}+\theta}{D} & \frac{\varphi}{D} & 1 & \frac{(-y_{x1} \cdot \varphi + y_{y1} \cdot \alpha + \theta \cdot \alpha)}{y_{x1} \cdot D} \\ -z \cdot \frac{y_{y1}+\theta}{D} & z \cdot \frac{x_{y1}}{D} & 0 & \frac{x_{y1}}{D} & \frac{y_{y1}+\theta}{D} & -\frac{\varphi}{D} & 1 & -\frac{(-y_{x1} \cdot \varphi + y_{y1} \cdot \alpha + \theta \cdot \alpha)}{y_{x1} \cdot D} \\ z \cdot \frac{y_{x1}}{D} & z \cdot \frac{(x_{x1}-\beta)}{D} & 1 & \frac{(x_{x1}-\beta)}{D} & -\frac{y_{x1}}{D} & -\varphi \cdot \frac{(x_{x1}-\beta)}{(x_{y1} \cdot D)} & -1 & \frac{(\alpha \cdot x_{y1} + \varphi \cdot x_{x1} - \varphi \cdot \beta)}{x_{y1} \cdot D} \\ -z \cdot \frac{y_{x1}}{D} & -z \cdot \frac{(x_{x1}-\beta)}{D} & 1 & -\frac{(x_{x1}-\beta)}{D} & \frac{y_{x1}}{D} & \varphi \cdot \frac{(x_{x1}-\beta)}{(x_{y1} \cdot D)} & -1 & -\frac{(\alpha \cdot x_{y1} + \varphi \cdot x_{x1} - \varphi \cdot \beta)}{x_{y1} \cdot D} \end{bmatrix} \cdot \begin{bmatrix} Fx \\ Fy \\ Fz \\ Tx \\ Ty \\ Tz \\ 0.5 \cdot Fz \\ 0.5 \cdot Tz \end{bmatrix}$$

wherein $$\varphi = C_1 \cdot \sin\left(\frac{2 \cdot \pi \cdot y}{\tau}\right);$$

$$\theta = C_2 \cdot \sin\left(\frac{2 \cdot \pi \cdot y}{\tau} + \frac{\pi}{2}\right);$$

$$\alpha = C_1 \cdot \sin\left(\frac{2 \cdot \pi \cdot x}{\tau}\right);$$

$$\beta = C_2 \cdot \sin\left(\frac{2 \cdot \pi \cdot x}{\tau} + \frac{\pi}{2}\right);$$

9. A computer program according to claim 8, wherein the correction is derived from the calculated primary forces.

10. A computer program according to claim 8, wherein the spurious torque generated by each coil set acts about an axis that is perpendicular to the direction of the at least one primary force produced by the coil set and parallel to the plane of coils within the coil set.

11. A computer program according to claim 8, wherein calculating the corrections comprises:

calculating the spurious torques that would be caused by the calculated primary forces being applied by the coil sets without the corrections;

$D = (y_{x1} \cdot x_{y1} - \beta \cdot \theta + x_{x1} \cdot y_{y1} + x_{x1} \cdot \theta - \beta \cdot y_{y3});$ $Fx_{x\_}$ represents the force generated in a first direction, designated X, by a first X coil set x1 and a second X coil set x2;

$Fy_{y\_}$ represents the force generated in a second direction, perpendicular to the first direction and designated Y, by a first Y coil set y1 and a second Y coil set y2;

$Fz_{\_}$ represents a force generated in a third direction, perpendicular to the first and second directions and designated Z, by the X and Y coil sets x1, x2, y1 and y2;

C1 and C2 are constants for the specific planar motor;

x represents the position, in the X direction, of the moving part of the planar motor relative to a predetermined position on a stationary part;

y represents the position, in the Y direction, of the moving part of the planar motor relative to a predetermined position on the stationary part;

τ represents the pitch of the arrangement of permanent magnets used in the stationary part of the planar motor;

$x_{x1}$ represents the distance in the X direction between the point of action of the first X coil set x1 and the center of mass of the moving part of the planar motor and between the point of action of the second X coil set x2 and the center of mass of the moving part of the planar motor;

$x_{y1}$ represents the distance in the X direction between the point of action of the first Y coil set y1 and the center of mass of the moving part of the planar motor and between the point of action of the second Y coil set y2 and the center of mass of the moving part of the planar motor; $y_{x1}$ represents the distance in the Y direction between the point of action of the first X coil set x1 and the center of mass of the moving part of the planar motor and between the point of action of the second X coil set x2 and the center of mass of the moving part of the planar motor; $y_{y1}$ represents the distance in the Y direction between the point of action of the first Y coil set y1 and the center of mass of the moving part of the planar motor and between the point of action of the second Y coil set y2 and the center of mass of the moving part of the planar motor;

z represents the distance in the Z direction between the point of all of the coil sets and the center of mass of the moving part of the planar motor;

Fx represents the force on the moving part of the planar motor required in the X direction to position the moving part of the planar motor;

Fy represents the force on the moving part of the planar motor required in the Y direction to position the moving part of the planar motor;

Fz represents the force on the moving part of the planar motor required in the Z direction to position the moving part of the planar motor;

Tx represents the torque on the moving part of the planar motor required about an axis parallel to the X direction to position the moving part of the planar motor;

Ty represents the torque on the moving part of the planar motor required about an axis parallel to the Y direction to position the moving part of the planar motor; and Tz represents the torque on the moving part of the planar motor required about an axis parallel to the Z direction to position the moving part of the planar motor.

14. A computer program according to claim 8, wherein in positioning the planar motor, only four coil-sets are used to provide the positioning force and the four coil-sets produce forces in two orthogonal directions parallel to a plane of the coil-sets.

15. A lithographic projection apparatus, comprising:

a radiation system constructed and arranged to provide a beam of radiation;

a support structure constructed and arranged to support a patterning device, the patterning device constructed and arranged to pattern the beam according to a desired pattern;

a substrate table constructed and arranged to hold a substrate;

a projection system constructed and arranged to project the patterned beam onto a target portion of the substrate; and a planar motor constructed and arranged to position one of the patterning device and the substrate table, the planar motor comprising a plurality of coil sets, each coil set producing at least one primary force in a given direction and at least one spurious torque, associated with the primary force, to the moving part of the planar motor; and a controller that:

calculates the primary forces required to position the planar motor at a predetermined position;

calculates the spurious torques associated with the calculated primary forces;

calculates a correction for each of the calculated primary forces such that the effect of the correction attenuates the sum of the calculated spurious torques on a moving part of the planar motor;and provides a control signal to each of the coil-sets to apply the sum of the calculated primary forces and the corrections at each coil-set.

16. An apparatus according to claim 15, wherein the correction is derived from the calculated primary forces.

17. An apparatus according to claim 15, wherein the spurious torque generated by each coil set acts about an axis that is perpendicular to the direction of the at least one primary force produced by the coil set and parallel to the plane of coils within the coil set.

18. An apparatus according to claim 15, wherein calculating the corrections comprises:

calculating the spurious torques that would be caused by the calculated primary forces being applied by the coil sets without the corrections;

calculating a combination of supplementary primary forces in the coil sets that produces torques on the moving part of the planar motor that are equal and opposite to the sum of the spurious torques; and using the supplementary forces as the corrections.

19. An apparatus according to claim 15, wherein calculating the corrections comprises:

calculating correction forces for each of the calculated primary forces such that, when the sum of the correction forces and the calculated primary forces are applied by the coil sets, the sum of the effect of the calculated primary forces and spurious torques is substantially the forces and torques required to position the planar motor at the predetermined position.

20. An apparatus according to claim 19, wherein calculating the required sum of the correction forces and the required primary forces is performed according to the equation:

$$\begin{bmatrix} Fx_{x1} \\ Fx_{x2} \\ Fy_{y1} \\ Fy_{y2} \\ Fz_{x1} \\ Fz_{x2} \\ Fz_{y1} \\ Fz_{y2} \end{bmatrix} = \frac{1}{2} \cdot \begin{bmatrix} 1 & 0 & 0 & 0 & 0 & 0 & 0 & \frac{1}{y_{x1}} \\ 1 & 0 & 0 & 0 & 0 & 0 & 0 & -\frac{1}{y_{x1}} \\ 0 & 1 & 0 & 0 & 0 & \frac{1}{x_{y1}} & 0 & -\frac{1}{x_{y1}} \\ 0 & 1 & 0 & 0 & 0 & -\frac{1}{x_{y1}} & 0 & \frac{1}{x_{y1}} \\ z \cdot \frac{y_{y1} + \theta}{D} & -z \cdot \frac{x_{y1}}{D} & 0 & -\frac{x_{y1}}{D} & -\frac{y_{y1} + \theta}{D} & \frac{\varphi}{D} & 1 & \frac{(-y_{x1} \cdot \varphi + y_{y1} \cdot \alpha + \theta \cdot \alpha)}{y_{x1} \cdot D} \\ -z \cdot \frac{y_{y1} + \theta}{D} & z \cdot \frac{x_{y1}}{D} & 0 & \frac{x_{y1}}{D} & \frac{y_{y1} + \theta}{D} & -\frac{\varphi}{D} & 1 & \frac{(-y_{x1} \cdot \varphi + y_{y1} \cdot \alpha + \theta \cdot \alpha)}{y_{x1} \cdot D} \\ z \cdot \frac{y_{x1}}{D} & z \cdot \frac{(x_{x1} - \beta)}{D} & 1 & \frac{(x_{x1} - \beta)}{D} & -\frac{y_{x1}}{D} & -\varphi \cdot \frac{(x_{x1} - \beta)}{(x_{y1} \cdot D)} & -1 & \frac{(\alpha \cdot x_{y1} + \varphi \cdot x_{x1} - \varphi \cdot \beta)}{x_{y1} \cdot D} \\ -z \cdot \frac{y_{x1}}{D} & -z \cdot \frac{(x_{x1} - \beta)}{D} & 1 & -\frac{(x_{x1} - \beta)}{D} & \frac{y_{x1}}{D} & \varphi \cdot \frac{(x_{x1} - \beta)}{(x_{y1} \cdot D)} & -1 & -\frac{(\alpha \cdot x_{y1} + \varphi \cdot x_{x1} - \varphi \cdot \beta)}{x_{y1} \cdot D} \end{bmatrix} \cdot \begin{bmatrix} Fx \\ Fy \\ Fz \\ Tx \\ Ty \\ Tz \\ 0.5 \cdot Fz \\ 0.5 \cdot Tz \end{bmatrix}$$

wherein $$\varphi = C_1 \cdot \sin\left(\frac{2 \cdot \pi \cdot y}{\tau}\right);$$

$$\theta = C_2 \cdot \sin\left(\frac{2 \cdot \pi \cdot y}{\tau} + \frac{\pi}{2}\right);$$

$$\alpha = C_1 \cdot \sin\left(\frac{2 \cdot \pi \cdot x}{\tau}\right);$$

$$\beta = C_2 \cdot \sin\left(\frac{2 \cdot \pi \cdot x}{\tau} + \frac{\pi}{2}\right);$$

$D = (y_{x1} \cdot x_{y1} - \beta \cdot \theta + x_{x1} \cdot y_{y1} + x_{x1} \cdot \theta - \beta \cdot y_{y3})$;

$Fx_{x\_}$ represents the force generated in a first direction, designated X, by a first X coil set x1 and a second X coil set x2;

$Fy_{y\_}$ represents the force generated in a second direction, perpendicular to the first direction and designated Y, by a first Y coil set y1 and a second Y coil set y2;

$Fz_{\_}$ represents a force generated in a third direction, perpendicular to the first and second directions and designated Z, by the X and Y coil sets x1, x2, y1 and y2;

C1 and C2 are constants for the specific planar motor;

x represents the position, in the X direction, of the moving part of the planar motor relative to a predetermined position on a stationary part;

y represents the position, in the Y direction, of the moving part of the planar motor relative to a predetermined position on the stationary part;

τ represents the pitch of the arrangement of permanent magnets used in the stationary part of the planar motor;

$x_{x1}$ represents the distance in the X direction between the point of action of the first X coil set x1 and the center of mass of the moving part of the planar motor and between the point of action of the second X coil set x2 and the center of mass of the moving part of the planar motor;

$x_{y1}$ represents the distance in the X direction between the point of action of the first Y coil set y1 and the center of mass of the moving part of the planar motor and between the point of action of the second Y coil set y2 and the center of mass of the moving part of the planar motor; $y_{x1}$ represents the distance in the Y direction between the point of action of the first X coil set x1 and the center of mass of the moving part of the planar motor and between the point of action of the second X coil set x2 and the center of mass of the moving part of the planar motor; $y_{y1}$ represents the distance in the Y direction between the point of action of the first Y coil set y1 and the center of mass of the moving part of the planar motor and between the point of action of the second Y coil set y2 and the center of mass of the moving part of the planar motor;

z represents the distance in the Z direction between the point of action of all of the coil sets and the center of mass of the moving part of the planar motor;

Fx represents the force on the moving part of the planar motor required in the X direction to position the moving part of the planar motor;

Fy represents the force on the moving part of the planar motor required in the Y direction to position the moving part of the planar motor;

Fz represents the force on the moving part of the planar motor required in the Z direction to position the moving part of the planar motor;

Tx represents the torque on the moving part of the planar motor required about an axis parallel to the X direction to position the moving part of the planar motor;

Ty represents the torque on the moving part of the planar motor required about an axis parallel to the Y direction to position the moving part of the planar motor; and Tz represents the torque on the moving part of the planar motor required about an axis parallel to the Z direction to position the moving part of the planar motor.

21. An apparatus according to claim 15, wherein in the positioning, only four coil-sets are used to provide the positioning force; and the four coil-sets produce forces in two orthogonal directions parallel to a plane of the coil-sets.

* * * * *